United States Patent
Chen et al.

(10) Patent No.: US 10,914,608 B2
(45) Date of Patent: Feb. 9, 2021

(54) DATA ANALYTIC ENGINE TOWARDS THE SELF-MANAGEMENT OF COMPLEX PHYSICAL SYSTEMS

(71) Applicant: NEC Laboratories America, Inc., Princeton, NJ (US)

(72) Inventors: Haifeng Chen, West Windsor, NJ (US); Kenji Yoshihira, Princeton Junction, NJ (US); Guofei Jiang, Princeton, NJ (US)

(73) Assignee: NEC Corporation

( * ) Notice: Subject to any disclaimer, the term of this patent is extended or adjusted under 35 U.S.C. 154(b) by 440 days.

(21) Appl. No.: 15/653,115

(22) Filed: Jul. 18, 2017

(65) Prior Publication Data

US 2017/0314961 A1 Nov. 2, 2017

Related U.S. Application Data

(63) Continuation-in-part of application No. 14/050,808, filed on Oct. 10, 2013, now abandoned.
(Continued)

(51) Int. Cl.

| | |
|---|---|
| *G01D 3/08* | (2006.01) |
| *G06N 5/04* | (2006.01) |
| *G06K 9/62* | (2006.01) |
| *G06F 17/18* | (2006.01) |
| *G06F 11/34* | (2006.01) |
| *G06K 9/00* | (2006.01) |
| *G06F 11/30* | (2006.01) |

(Continued)

(52) U.S. Cl.
CPC .......... *G01D 3/08* (2013.01); *G06F 11/3072* (2013.01); *G06F 11/3447* (2013.01); *G06F 17/18* (2013.01); *G06F 30/20* (2020.01); *G06K 9/00536* (2013.01); *G06K 9/6247* (2013.01); *G06K 9/6252* (2013.01); *G06N 5/04* (2013.01); *G06F 11/3055* (2013.01); *G06F 2201/805* (2013.01); *G06F 2201/81* (2013.01); *G06N 7/08* (2013.01); *G06N 20/00* (2019.01)

(58) Field of Classification Search
None
See application file for complete search history.

(56) References Cited

PUBLICATIONS

Hulten, Geoff, Laurie Spencer, and Pedro Domingos. "Mining time-changing data streams." Proceedings of the seventh ACM SIGKDD international conference on Knowledge discovery and data mining. ACM, 2001. (Year: 2001).*

(Continued)

*Primary Examiner* — Daniel T Pellett
(74) *Attorney, Agent, or Firm* — Joseph Kolodka

(57) ABSTRACT

Systems and methods for anomaly detection in complex physical systems, including extracting features representative of a temporal evolution of the complex physical system, and analyzing the extracted features by deriving vector trajectories using sliding window segmentation of time series, applying a linear test to determine whether the vector trajectories are linear, and performing subspace decomposition on the vector trajectory based on the linear test. A system evolution model is generated from an ensemble of models, and a fitness score is determined by analyzing different data properties of the system based on specific data dependency relationships. An alarm is generated if the fitness score exceeds a predetermined number of threshold violations for the different data properties.

17 Claims, 7 Drawing Sheets

Related U.S. Application Data

(60) Provisional application No. 61/719,475, filed on Oct. 28, 2012, provisional application No. 61/713,006, filed on Oct. 12, 2012.

(51) Int. Cl.
*G06F 30/20* (2020.01)
*G06N 20/00* (2019.01)
*G06N 7/08* (2006.01)

(56) References Cited

PUBLICATIONS

Haifeng Chen, et al., Exploiting Local and Global Invariants for the Management of Large Scale Information Systems, Eighth IEEE Conference on Data Mining, Dec. 2008, pp. 113-122.

Haifeng Chen, et al., Monitoring High Dimensional Data for Failure Detection and Localization Inlarge-Scale Computing Systems. IEEE Transactions on Knowledge and Data Enginemig, Jan. 2008, pp. 13-25, vol. 20, No. 1.

Ira Cohen, et al., Correlating Instrumentation Data to System States: a Building Block for Automated Diagnosis and Control, Proceedings of the 6th Conference on Symposium on Operating Systems Design & Implementation, 2004, pp. 16-16, vol. 6, OSDI.

Peter Grassberger, et al., Measuring the Strangeness of Strange Attractors, Physica 9D, May 1983, pp. 189-208.

Guofei Jiang, et al., Efficient and Scalable Algorithms for Inferring Invariants in Distributed Systems, IEEE Transactions on Knowledge and Data Engineering, Nov. 2007, pp. 1508-1523, vol. 19, No. 11.

Rudiger Klein, et al., Complex Events and Actions to Control Cyber-Physical Systems, Proceedings of the 5th ACM International Conference on Distributed Event-Based System, DEBS, pp. 29-38, Jul. 2011.

David Patterson, et al., Recovery Oriented Computing (ROC): Motivation, Definition, Techniques, and Case Studies, Computer Science Technical Report, Computer Science, Mar. 2002, pp. 2-16.

Hanhuai Shan, et al., Extracting Overlay Invariants of Distributed Systems for Autonomic System Management, 4th IEEE International Conference on Self-Adaptive and Self-Organizing Systems (SASO 2010), Sep. 2010, pp. 41-50.

Michael Small, Applied Nonlinear Time Series Analysis: Applications in Physics, Physiology and Finance. World Scientific Series on Nonlinear Science, 2005, Series A, vol. 52, pp. 1-46.

Stephan W. Wegerich, Similarity Based Modeling of Time Synchronous Averaged Vibration Signals for Machinery Health Monitoring, Aerospace Conference Proceedings IEEE, Mar. 2004. vol. 6, pp. 3654-3662.

Nela Zavaljevski, et al., Sensor Fault Detection in Nuclear Power Plants Using Multivariate State Estimation Tchnique and Support Vector Machines, Proceeding of the 3rd International Conference of the Yugoslav Nuclear Society, Oct. 2000, pp. 1-8.

J. D. Meiss, Differential Dynamical Systems, Society for Industrial and Applied Mathematics, Philadelphia, PA, USA, Nov. 2007, Chapter 4, pp. 105-163.

\* cited by examiner

DATA ANALYTIC ENGINE TOWARDS THE SELF-MANAGEMENT OF COMPLEX PHYSICAL SYSTEMS

RELATED APPLICATION INFORMATION

This application claims priority to provisional application Ser. No. 61/713,006, filed on Oct. 12, 2012, and provisional application Ser. No. 61/719,475, filed on Oct. 28, 2012, each incorporated herein by reference, and is a continuation-in-part of U.S. patent application Ser. No. 14/050,808, filed on Oct. 10, 2013.

BACKGROUND

Technical Field

The present invention relates to management of complex physical systems, and, in particular, to anomaly detection in complex physical systems by modeling, analyzing, and managing time series dynamics in complex physical systems.

Description of the Related Art

Recently, cyber-physical systems (CPS) have risen to prominence with examples including automobile and intelligent transportation systems, medical devices and healthcare systems, smart grid, industrial monitoring, etc. Since CPS integrates computing, communication, and storage capabilities in the monitoring entities, a significant amount of measurement data can now be collected, which contains useful knowledge to provide an opportunity for system self-management. Modern industries, such as power plant systems, chemical systems and a variety of manufacturers, deploy massive sensors to monitor the status of physical systems. As a result, a large amount of time series observations are collected from the massive sensors and an effective method is needed to model the system dynamics from the data. A good modeling of the underlying dynamics is important for a wide range of applications, such as enhancing the understanding of the underlying dynamics, improving predictive capabilities, monitoring the status of the system, and facilitating anomaly detection and failure diagnosis.

There has been research analyzing measurement data from physical systems to improve the self-manageability of systems, and this research may be classified into two categories: domain specific techniques and domain independent solutions. The domain specific techniques mainly rely on system experts to define rules or policies to extract related knowledge from the data, thus a full understanding of the properties of the systems are necessary. Such methods require extensive human involvement and are domain specific. Also, it may be difficult to obtain complete domain knowledge with the increasing of system scale and complexity. The domain independent solutions attempt to extract knowledge from data by general analytic tools rather than systems experts, (e.g., similarity based approach, support vector machine (SVM) based learning method, etc.). However, their solutions need large amount historical data and are computationally expensive.

Since CPS integrates computing, communication, and storage capabilities in the monitoring entities, a significant amount of measurement data can now be collected, which contains useful knowledge to provide an opportunity for system self-management. However, a number of challenges exist to extract knowledge from measurement data. For example, the data usually have thousands or even millions of attributes with each exhibiting different behaviors. Some attributes are also correlated with each other due to the dependencies between system components. It is necessary to have advanced analytic techniques for system measurements to benefit management tasks such as anomaly detection, capacity planning, and so on

SUMMARY

A method for anomaly detection in complex physical systems, including extracting, using physical sensors deployed in a complex physical system, features representative of a temporal evolution of the complex physical system, and analyzing, in real time, the extracted features by deriving one or more vector trajectories by performing sliding window segmentation of one or more time series, applying a linear test to determine whether the one or more vector trajectories are linear or nonlinear, and performing linear or nonlinear subspace decomposition on the vector trajectory based on the linear test. A system evolution model is generated from an ensemble of models based on the analysis of the extracted features of the complex physical system, and each of the ensemble of models corresponds to different data properties of the complex physical system. A fitness score is determined by analyzing a plurality of the different data properties of the complex physical system based on specific data dependency relationships, the type of analysis being determined based on particular properties of the features extracted and corresponding aspects of the complex physical system. An alarm is generated if the fitness score exceeds a predetermined number of threshold violations for any of the plurality of different data properties.

A system for anomaly detection in complex physical systems, including a processor coupled to a memory, the processor being configured for extracting, using physical sensors deployed in a complex physical system, features representative of a temporal evolution of the complex physical system, and analyzing, in real time, the extracted features by deriving one or more vector trajectories by performing sliding window segmentation of one or more time series, applying a linear test to determine whether the one or more vector trajectories are linear or nonlinear, and performing linear or nonlinear subspace decomposition on the vector trajectory based on the linear test. A system evolution model is generated from an ensemble of models based on the analysis of the extracted features of the complex physical system, and each of the ensemble of models corresponds to different data properties of the complex physical system. A fitness score is determined by analyzing a plurality of the different data properties of the complex physical system based on specific data dependency relationships, the type of analysis being determined based on particular properties of the features extracted and corresponding aspects of the complex physical system. An alarm is generated if the fitness score exceeds a predetermined number of threshold violations for any of the plurality of different data properties A computer program product for anomaly detection in one or more complex physical systems, the computer program product comprising a non-transitory computer readable storage medium having program instructions embodied therewith, the program instructions executable by a processor to cause the processor to perform a method including extracting, using physical sensors deployed in a complex physical system, features representative of a temporal evolution of the complex physical system, and analyzing, in real time, the extracted features by deriving one or more vector trajectories by performing sliding window segmentation of one or more time series, applying a linear test to determine whether the one or more vector trajectories are linear or nonlinear, and performing linear or nonlinear subspace decomposition on the vector trajectory based on the linear test. A system evolution model is generated from an ensemble of models based on the analysis of the extracted features of the complex physical system, and each of the ensemble of models corresponds to different data properties of the complex physical system. A fitness score is determined by analyzing a plurality of the different data properties of the complex physical system based on specific data dependency relationships, the type of analysis being determined based on particular properties of the features extracted and corresponding aspects of the complex physical system. An alarm is generated if the fitness score exceeds a predetermined number of threshold violations for any of the plurality of different data properties These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
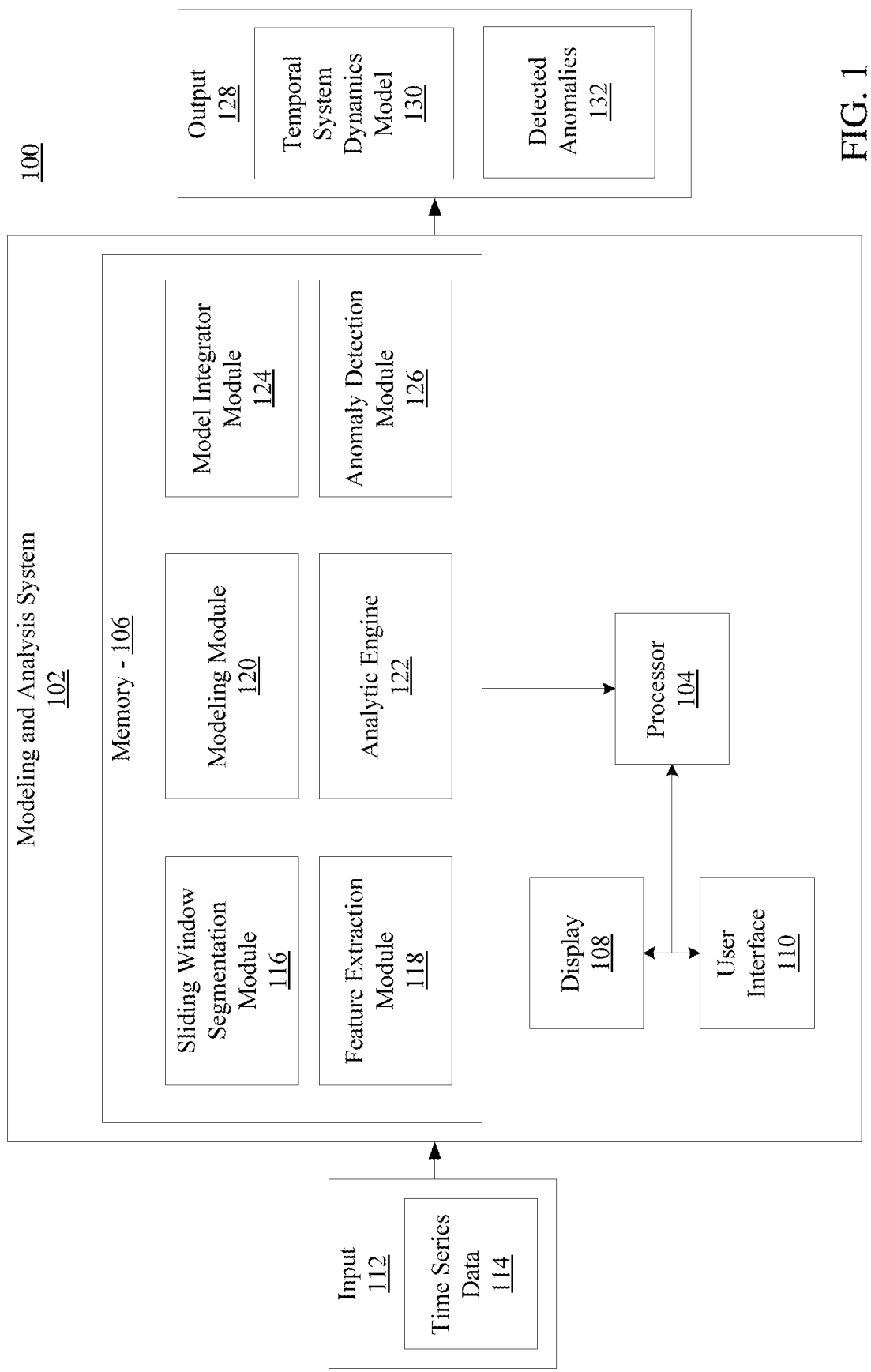
FIG. 1 is a block/flow diagram of a computing system for modeling time series dynamics in accordance with the present principles.

The process statuses of complex physical systems may be monitored by a large number of sensors. The processes in a complex physical system usually develop some temporal patterns which are inherently governed by the underlying dynamical system and can be captured by the analysis of the time series observations from the sensors. Indeed, the modeling of the system dynamics for temporal patterns can be beneficial to a wide range of applications. However, given the noisy, nonlinear and heterogeneous time series data, it is a critical challenge to model the system dynamics without an a priori knowledge of the system. In one embodiment according to the present principles, a method to model time series dynamics without much a priori knowledge about the system is illustratively provided.

The above-mentioned method may be based on the fact that an underlying dynamical system of a complex physical system is deterministic and that the state trajectory demonstrates a self-similar behavior governed by a certain smooth evolution function. Specifically, sliding window segmentation may be performed on the time series data to derive a vector trajectory that includes all the dynamics information. Then, features of system dynamics may be extracted by linear or nonlinear subspace decomposition, which may be decided by an intrinsic dimension based criterion. Next, an approach with temporal evolution awareness may be employed to model the system dynamics.

There are several challenges to model the system dynamics. First, a general method to model the time series dynamics without a priori knowledge on the system model may be employed, given only the time series observations from such physical systems, without any background of the underlying system model itself. Second, the time series from physical systems may exhibit both linear and nonlinear behaviors. Modeling linear time series dynamics has been researched, but it is still a challenge to model nonlinear time series dynamics from the observation sequences. Finally, because the time series data from physical systems are heterogeneous, the time series are dramatically different in terms of shape, trend, seasonal variation and periodicity. Therefore, a general a priori knowledge free modeling method is needed to model system dynamics from the noisy, nonlinear and heterogeneous time series.

In one embodiment, the underlying dynamical system of a physical system may be deterministic, and this deterministic characteristic may be exploited according to the present principles. For a deterministic system, the underlying system dynamical states may lie on a manifold in the state space endowed with a family of smooth evolution functions. Therefore there may be two important steps involved in the modeling of the nonlinear time series dynamics. First, good features that represent the evolution of the dynamical system may be extracted. Second, a modeling method that considers the temporal evolution of the features of dynamics is employed according to the present principles. Features of system dynamics that capture the temporal dynamics of a time series may be extracted through sliding window segmentation. A linear or nonlinear subspace method may be employed to extract features of dynamics based on intrinsic dimension criterion.

In one embodiment, a general data analytic engine for physical systems may be employed to reduce the burden from operators in management tasks according to the present principles. Measurements may be collected during normal system operations, and the engine may treat the data from each attribute as a time series, and may discover typical properties or patterns from and across time series. For example, some time series may demonstrate periodic behaviors due to the repeated physical processes that generate the data. Some time series may be highly correlated with some others in the measurements. Given a large number of time series, the engine may discover related properties for each time series and profile them based on the learned patterns. The learned data profiles may bridge the gap between raw data and system management policies, and hence may help operators to better understand the system and improve performance. The learned data profiles may be employed to detect anomalies in the system. For example, given the online measurements from system operations, the newly observed data may be evaluated with respect to its related profile, and if there are significant deviations, some alerts may be issued to notify operators to check the system operation.

In one embodiment, the unique features of data characteristics in physical systems may provide a guideline for developing the analytic engine. Considering that there may be a high diversity of data behaviors, the engine may include an ensemble of analysis models, each of which may explore a specific property from the data (e.g., constant model, periodic model, cumulative sum (CUSUM) model, AutoRegressive model with eXternal input (ARX), etc.). The properties considered in those models may include different compositions of attributes, including those from a single attribute, every pair of attributes, a group of attributes, or the whole data set. Each model in the engine may discover the group of time series that follows the property it is associated with. As the models in the engine may cover all the measurement data, each time series may ultimately find at least one model that can capture the behavior of its evolutions.

As the output, the engine may provide a profile for each attribute in the monitoring data. The profile may describe the expected behavior of a time series according to the learned properties in models. For example, the mean and variance statistics may be employed to profile a time series whose values are close to a constant. The shape and length of the period may be employed to profile periodic time series. Based on those profiles, the status of future time series may be checked, and hence detect anomalies of system operation. For example, given a newly observed value of each attribute, it may be compared with the expected value computed from the profile, and an alert may be generated if their deviation is large (e.g., over a threshold). By integrating and analyzing alerts from all the time series, the engine may provide a clear indication about the global status of system operations.

The engine employed according to the present principles is efficient because the learned properties of each time series may be represented in a parametric way (e.g., using equations and parameters), which provides efficient computation times. In addition, a common input and output interface for each model in the analytic engine may be employed, and as a result, new models may be easily added to further improve the engine performance.

Referring now to the drawings in which like numerals represent the same or similar elements and initially to FIG. 1, a block/flow diagram showing a computing system for modeling time series dynamics 100 is illustratively depicted in accordance with one embodiment of the present principles. The system 100 may include a workstation or system 102. The system 102 preferably includes one or more processors 104 and memory 106 for storing applications, modules, and other data.

In one embodiment according to the present principles, the system 102 may include one or more displays 108 for viewing. The displays 108 may permit a user to interact with the system 102 and its components and functions. This may be further facilitated by a user interface 110, which may include a mouse, joystick, or any other peripheral or control to permit user interaction with the system 102 and/or its devices. It should be understood that the components and functions of the system 102 may be integrated into one or more systems or workstations.

The system 102 may receive input 112, which may include time series data 114, and a sliding window segmentation module 116 may perform sliding window segmentation on the time series data 114. A feature extraction module 118 may extract features of system dynamics by linear or nonlinear subspace composition that represent the temporal evolution of the system 102, and a modeling module 120 and/or an analytic engine 122 may model system dynamics based on the features extracted by the feature extraction module 118. A model integrator module 124 may be implemented to combine information from different models, and to generate an overall report of system operation. The system may generate output in block 128, which may include a temporal system dynamics model 130 and anomalies 132 detected by an anomaly detection module in block 126.

Figure 2:
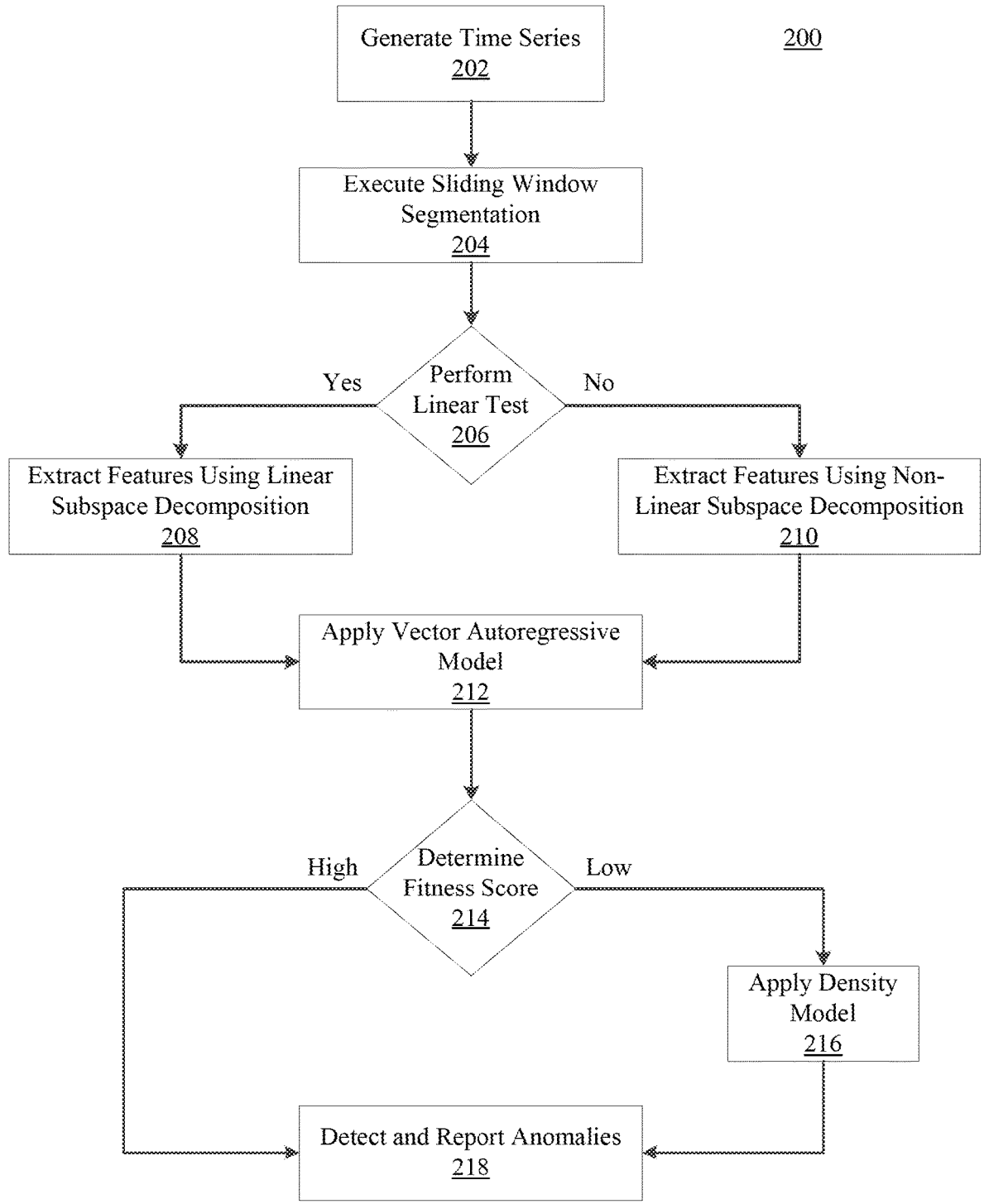
FIG. 2 is a block/flow diagram of a method for modeling time series dynamics in accordance with the present principles.

Referring now to FIG. 2, a method for modeling time series dynamics 200 is illustratively shown in accordance with the present principles. In one embodiment, one or more time series are generated in block 202. To extract representative features of time series dynamics, sliding window segmentation of the time series may be performed in block 204 to derive a vector trajectory. In time series segmentation, the dynamics of a time series $X=\{x_1, x_2, \ldots, x_t, \ldots\}$ may be represented by $x_t$ as well as its past observations, and $x_1, x_2, \ldots x_t$ may represent observations at different times. As a result, time series dynamics may be contained in one or more vector trajectories constructed by sliding window segments of time series with a window size d. A linear test 206 may be performed to determine whether a time series is linear or nonlinear. The linear test 206 may employ, for example, an intrinsic dimension based criterion to determine whether to use a linear subspace decomposition or nonlinear subspace decomposition method to derive the features of system dynamics. A linear subspace decomposition may then be performed on the vector trajectory to extract features of system dynamics in block 208, and the linear subspace decomposition may be optimal in the least square sense. For high level nonlinear behavior time series, a nonlinear subspace decomposition may be performed on the vector trajectory to extract features of system dynamics in block 210.

In one embodiment according to the present principles, a complementary method may be employed to model system dynamics. A Vector-Autoregressive (VAR) model 212 may be employed to model the trajectory of features. A fitness score may be determined in block 214, and for time series that may lack smoothness in feature trajectories, these time series feature trajectories may result in a low fitness score in the VAR model, and a density based model 216 may be employed to model the behaviors. The built model may be applied for applications such as, for example, anomaly detection and reporting in block 218 for time series with any fitness score (e.g., High, Low).

In one embodiment, a unique feature series pattern may arise for a deterministic physical system starting from a given state. To model the system dynamics, good features that represent the evolution of the system dynamics may be extracted. The time series may first be segmented with a sliding window size to derive a vector trajectory that includes all the dynamics information in block 204. Then the features of system dynamics may be extracted by linear or nonlinear subspace decomposition in blocks 208 and 210, which may be decided by an intrinsic dimension based criterion linear test in block 206. The extracted features may be non-redundant which may be beneficial for the modeling complexity and robust to the noise in the data, and the extracted features may present smooth trajectories.

In one embodiment according to the present principles, a time series $X=(x_1, x_1, \ldots, x_t, \ldots)$ from a physical system may be generated in block 202. A consecutive subsequence with length d to fix the state may be employed. In a physical system, a mapping function, which may be unknown, may generate the time series and may be modeled as differential equations to represent the underlying physical process. A state of the physical system may be represented as a vector sequence that covers consecutive observations. Time series dynamics may be included in a segment of time series, and the dynamics of a time series X may be represented by $x_t$ as well as its past observations. As such, time series segmentation may be advantageously employed according to the present principles to model the system dynamics.

In one embodiment, moving window segmentation may be performed by segmenting time series observations with a sliding window of size d in block 204 according to the present principles using, for example, $z_t = [x_t, x_{t+1} K, x_{t+(d-1)}]$. A segment vector trajectory matrix may then be generated (e.g., $Z=[z_1, z_2, \ldots z_n]^T$), where Z represents a trajectory matrix and $z_1, z_2, \ldots z_n$ may represent observations at different times. In trajectory matrix Z, the dynamics of the original time series may be represented by consecutive subsequences with length d. The trajectory matrix may include information about evolution of the dynamics of a time series. A subspace decomposition method may be employed to derive the features of system dynamics. As the dynamics may include linear and nonlinear dynamics, a linear or nonlinear subspace decomposition may be employed in blocks 208 and 210 based on a linear test (e.g., intrinsic dimension based criterion) in block 206.

In one embodiment, after determining the trajectory matrix Z, singular value decomposition may be applied using, for example, $Z_{d \times n} = U \Sigma V^T$, where elements of $\Sigma$ may be the singular values $\Sigma = \text{diag}(\lambda_1, \ldots, \lambda_k, \lambda_{r+1}, \ldots, \lambda_r)$, and d is length, n is the number of samples in a time series matrix, U is a transformed matrix, $V^T$ is a transposed matrix, and $\lambda$ may represent the outcome of the transformation. Based on the magnitude of singular values $\lambda_i$, the space of Z may be decomposed into signal and noise subspaces. The method $Z_{d \times n} = U \Sigma V^T = U_S \Sigma_S V_S^T + U_n \Sigma_n V_n^T$, where $U_S = [u_1, u_2, \ldots, u_k]$ may be selected from the left k columns of U, may form the bases of signal space, where $U_S$ represents the signal part of trajectory matrix U, and $u_1, u_2, \ldots u_k$ represent elements in the U matrix. An eigenvector number k may be chosen such that $$k = \min_k \left\{ \frac{\sum_{i=1}^{k} \lambda_i^2}{\sum \lambda_i^2} \geq \varepsilon \right\},$$

where $\varepsilon$ is a predefined threshold value.

In one embodiment, a vector $z \in R^d$ may be represented by the summation of two projection vectors from two subspaces $z = \hat{z} + \tilde{z}$, with the signal part of z and noise part $\tilde{z}$, where z represents a vector, R is a real number space, d is a d-dimensional space. A low-dimensional representation of in the signal subspace, which may be represented as $y = U_s^T z$, may be the principal component vector of z and may represent the r-dimensional coordinates of in the signal subspace, may be obtained. Then the feature of system dynamics may be defined as $y = U_s^T z$.

In one embodiment, a time series (e.g., $\{x_1, \ldots, x_t, \ldots\}$) may represent high level nonlinear behaviors. The trajectory matrix Z constructed by, for example, sliding window segmentation, may lie on a nonlinear manifold. Therefore, the linear subspace decomposition, which may be optimal in the least square sense, may not be appropriate for this type of time series. Instead, when presented with a high-level nonlinearity, a nonlinear transformation of the segment trajectory may be applied into a feature space F by $\Phi: z \rightarrow \Phi(z)$, where $\Phi:z$ represents a feature of z trajectory. Then subspace decomposition may be performed in the feature space F to extract features of system dynamics in block 210.

In one embodiment, after determining a set of N segment trajectory vectors $z_j$, they may be mapped into higher-dimensional feature space by using, for example, $z \rightarrow \Phi(z)$, which may result in $\Phi(Z) = [\Phi(z), \Phi(z_2), \ldots, \Phi(z_n)]$. In the feature space, subspace decomposition may then be performed on $\Phi(Z)$. The subspace decomposition on $\Phi(Z)$ may be equal to diagonalize $$C = \frac{1}{N} \sum_{j=1}^{N} \Phi(z_j) \Phi(z_j)^T,$$

where C represents a covariance matrix of $\Phi(Z)$, and N represents the number of elements.

The diagonalization may be equal to $\mathcal{K} \alpha = N \lambda \alpha$, where $\alpha$ denotes the column vector with entries $\alpha_1, \ldots, \alpha_N$. The equation $\mathcal{K}_{i,j} = (\Phi(z_i) \cdot \Phi(z_j))$ is called the Kernel function, and may be employed to compute the dot product instead of computing the mapping $\Phi$. Choosing the Kernel function $\mathcal{K}$ may be equivalent to choosing $\Phi$, the embedding map function. Commonly used kernel functions include polynomial kernel $\mathcal{K}(x_i, x_j) = (x_i^T x_j + 1)^p$ and Gaussian RBF kernel $$\mathcal{K}(x_i, x_j) = \exp\left(-\frac{1}{2\sigma^2} \|x_i - x_j\|\right)^2.$$

In one embodiment, $z_i$ may be a point with an image $\Phi(z_i)$ in F, and $V^k \Phi(z_i) = \sum_{j=1}^{N} \alpha_j^k \mathcal{K}(z_i + z_j)$ may be the nonlinear subspace decomposition corresponding to $\Phi$, where $V^k$ represents a transformation matrix. The method $$y_i = \sum_{j=1}^{N} \alpha_j^k \mathcal{K}(z_i + z_j)$$

may be defined as the system dynamic feature extracted in the feature space for segment vector $z_i$, where $y_i$ represents a transformation matrix.

In one embodiment, nonlinear models may be more accurate when the nonlinearities of the underlying structure are not effectively approximated by linear models. To determine which model to choose, given a set of measurements, an intrinsic dimension of data may first be estimated, and then a statistical test to decide whether use the linear or nonlinear model may be employed in block 206. Intrinsic dimension may be the number of variables employed to represent a manifold in $R^d$. An estimator designed to determine the dimension of the attractor of a chaotic dynamical system from samples of its time series may be employed according to the present principles. Given an r-dimensional data embedded in d-dimensional space, $z \in R^d$, the correlation integrals $(C_n)$ may be defined as $$C_n(\nu) = \frac{2}{n(n-1)} \sum_{i<j}^{n} I_{\|z_i - z_j\| < \nu},$$

where v is a vector, and n is the number of possible pairs. $C_n(v)$ may be computed for different $v_i$, and a line may be fit through [log $v_i$, log $C_n(v_i)$] to derive r, where r represents an intrinsic dimension.

In one embodiment, the linear model may be tested to determine whether the linear model may be sufficient for discovering the geometry of data samples based on the estimated dimension r. First, SVD of the data matrix may be performed, and whether the linear subspace with dimension r covers enough variances of the original space may be determined. The method may be defined as $$\gamma = \left[\frac{\lambda_1^2 + \lambda_2^2 + \ldots + \lambda_r^2}{\lambda_1^2 + \lambda_2^2 + \ldots + \lambda_k^2}\right]^{1/2},$$

where $\lambda_i$s are the eigenvalues form SVD, and k=min{d,n}, and $\gamma$ represents a ratio of signal power. If the $\gamma$ value is larger than a predefined threshold, linear model may be employed to characterize the normal data. Otherwise, the nonlinear model may be employed.

In one embodiment, the system dynamics may be modeled based on the extracted features. The projected features may demonstrate deterministic trajectories along time. Here, a complementary strategy may be adopted to model the system dynamics. A Vector-Autoregressive (VAR) technique may be employed in block 212 to model the trajectory of features as it considers temporal smoothness of trajectory. Because a small set of time series may lack smoothness in feature trajectories, these time series may result in a low fitness score in the VAR model, and as such, a density based approach may be employed to model their behaviors in block 216.

As a deterministic system may demonstrate a self-similar behavior, which means that a current state may be predicted based on states in recent past, current system states may be modeled as a linear function of previous states according to one embodiment. As such, the following recursive state transition function may be employed according to the present principles $$y_t = c + \sum_{i=1}^{p} \Pi_i \cdot y_{t-i} + \varepsilon(t),$$

where $y_t$ may be the extracted feature of the dynamical systems and $\Pi_i$ may be a k×k transition matrix. Vector c may be a vector of intercept terms so that nonzero mean system dynamics may be modeled. The influence of external randomness on a physical system during its interaction with its surroundings may be modeled using Gaussian noise $\varepsilon(t) \sim \mathcal{N}(0, \Sigma)$.

There may be several estimation methods employed to obtain VAR parameters in accordance with the present principles, such as the least square estimation and maximum likelihood estimation, which may be conditioned on the first p observations. In one embodiment, the least square estimation is employed according to the present principles. For example, there may be N+p system dynamic features $\{y_t\}_{1-p}^{N}$ available in one embodiment. The estimation may be conditioned on the first p observations (e.g., $\{y_{1-p}, \ldots, y_0\}$) and estimation may be based on the last N observations (e.g., $\{y_{1-p}, \ldots, y_N\}$). The model may be represented as a more compact expression as $y_t = Bw_t$, with B being the k×(kp+1) parameter matrix $B = [c, \Pi_1, \ldots, \Pi_p]$ and $w_t = [1, y_{t-1}, \ldots, y_{t-p}]^T$ of dimension kp+1.

In one embodiment, based on the initial conditional vector $w_1 = [1, y_0, \ldots, y_{1-p}]^T$, the estimation of $\hat{B}$ may be represented by $$\hat{B}_{k \times (kp+1)} = \left[\sum_{t=1}^{N} y_t w_t^T\right]\left[\sum_{t=1}^{N} w_t w_t^T\right]^{-1}.$$

It is noted that $\hat{B}$ may contain the constant term $\hat{c}$ and coefficients $\{\hat{\Pi}_1, \hat{\Pi}_2, \ldots, \hat{\Pi}_p\}$. Bayesian Information Criteria (BIC) may be employed to determine the optimal lag p value in the VAR model in block 212. After learning the system dynamic model parameters $\{\hat{c}, \hat{\Pi}_1, \hat{\Pi}_2, \ldots, \hat{\Pi}_p\}$ and given the p previous dynamic feature $y_t, y_{t-1}, \ldots, y_{t+1-p}$, the next one step dynamic feature value may be predicted by using, for example, $\hat{y}_{t+1} = \hat{c} + \hat{\Pi}_1 \cdot y_t + \hat{\Pi}_2 \cdot y_{t-1} + \ldots + \hat{\Pi}_p \cdot y_{t+1-p}$.

In one embodiment, the goodness of the modeling of system dynamics may be determined and tested by, for example, a metric in block 214. One method to measure goodness of fit is the R square ($R^2$), which may be defined as $$R^2 = 1 - \frac{\text{residual sum of squares}}{\text{total sum of squares}}.$$

Considering N predictions, the measure may become $$R^2 = 1 - \frac{\sum_{t=n+1} \|y_t - \hat{y}_t\|^2}{\sum_{t=n+1} \|y_t - \bar{y}\|^2},$$

where $\bar{y} = \Sigma_{t=n+1} y_t / N$. The $R^2$ fit score may be a scale free metric, and a large $R^2$ may indicate that the model provides a closer fit to the data.

In one embodiment, a small set of time series that are not effectively modeled using the VAR model, and for such time series, a low fitness score may be generated. A nonparametric density method may be employed to compensate for the low fitness score in block 216. Instead of modeling temporal coherence, a density based method may build a distribution on previously observed feature values. Density estimation may estimate $y_{t+1}$ by a weighted value of current $y_t$ plus its k-NN neighbors' differences. The nonparametric kernel density based regression model may be represented by $$\hat{y}_{t+1} = \sum_{k=1}^{N_n(y_t)} w(y_t, y_k)(y_{k+1} - y_k + y_t)$$

where $y_k$ may be one of the nearest neighbors of $y_t$ obtained from a k-NN search on previous feature values, and $y_{k+1}$ may be the corresponding next point of $y_k$ in the feature trajectory. The weights may be computed using a kernel function such as $$w(y_t, y_k) = \frac{K_h(\|y_t - y_k\|)}{\sum_{k=1}^{N_n(y_t)} K_h(\|y_t - y_k\|)}$$

with $$K_h(b) = \frac{1}{h} K\left(\frac{b}{h}\right)$$

where K(•) may be a kernel function and h may be the bandwidth of the kernel. In one embodiment, the Gaussian kernel may be set to be $\mathcal{N}(0,2)$.

In one embodiment, the present principles may be applied for time series anomaly detection in block 218. Anomalies in time series data may be data points that significantly deviate from the normal pattern of the data sequence, and temporal aspects of the data may be considered. A modeling and prediction based method may be employed, a system evolution model may be constructed from the past time series observations, and the current system status may be monitored by checking incoming data with the model to determine if an anomaly has occurred. The built system dynamic model may have already considered the temporal dynamical information of the original time series. Therefore anomaly detection may be performed by comparing the predicted feature value and the current feature value. For example, if $\hat{y}_{t+1}$ is the predicted feature value by $\hat{y}_{t+1} = \hat{c} + \hat{\Pi}_1 \cdot y_t + \hat{\Pi}_2 \cdot y_{t-1} + \ldots + \hat{\Pi}_p \cdot y_{t+1-p}$ or $$\hat{y}_{t+1} = \sum_{k=1}^{N_n(y_t)} w(y_t, y_k)(y_{k+1} - y_k + y_t),$$

as shown above, and the feature value for the next one step time series $x_{t+1}$ is $y_{t+1} = U_s^T z_{t+1}$, an alarm may be flagged when $\|\hat{y}_{t+1} - y_{t+1}\| \geq \varepsilon$ where $\varepsilon$ is a threshold value.

In one embodiment, the present principles may be applied to a large collection of time series from a physical system (e.g., a power plant system), and the anomaly detection performance may be compared. A plurality of time series may include sample observations collected over a period of time, and together these time series may capture the entire system state. The model may be built from normal operations, and anomalies may be detected based on the learned model.

The evaluation comparisons may include two parts. First, the present principles may be applied without nonlinear subspace decomposition with a standard time series modeling method autoregressive (AR) model. This means that the features of dynamics may be extracted by linear subspace decomposition. The AR method may be employed as a baseline because the VAR model may be employed on the feature vector, and the AR method may model the time series directly.

During the second comparison, the anomaly detection performances on high level nonlinear behavior time series that cannot go through the intrinsic dimension based linear test may be compared. More specifically, the anomaly detection performances between the nonlinear subspace decomposition and linear subspace decomposition may be compared. It is noted that the present principles provide for a much lower false alarm rate as compared to the AR model, and the present principles are more robust to different threshold levels. Furthermore, anomaly detection performance for all different levels of anomalies (e.g., weak, middle, strong), has been shown to achieve a more than 10 percent improvement of detection rate, while significantly lowering false alarms when compared to the AR model.

In one embodiment, the sliding window segmentation process may have one parameter, namely the window size d. The window size d may affect the performance of anomaly detection. To investigate the effect of window size d, a different value of d may be set, and the corresponding detection rate may be obtained. In one embodiment, increasing of window size d may improve detection precision. Increasing of window size d may recover the system dynamic better, which may improve detection precision. It is noted that the detection rate may not be sensitive to the change of window size. This may be in part because the reduced representation of the original trajectory may have already been extracted during the system dynamic extraction.

Furthermore, the reduced representation of the dynamic feature may avoid any potential underfitting problems during the system modeling stage. Without subspace decomposition, the dimensions may be d×d. When d is large, it may lead to underfitting problem for limited training samples. After subspace decomposition, the dimensions may become k×k, and k may be much smaller than d. An underfitting problem may arise when embedding dimension d is high, but the present principles may leverage this problem by employing system dynamic feature extraction.

Figure 3:
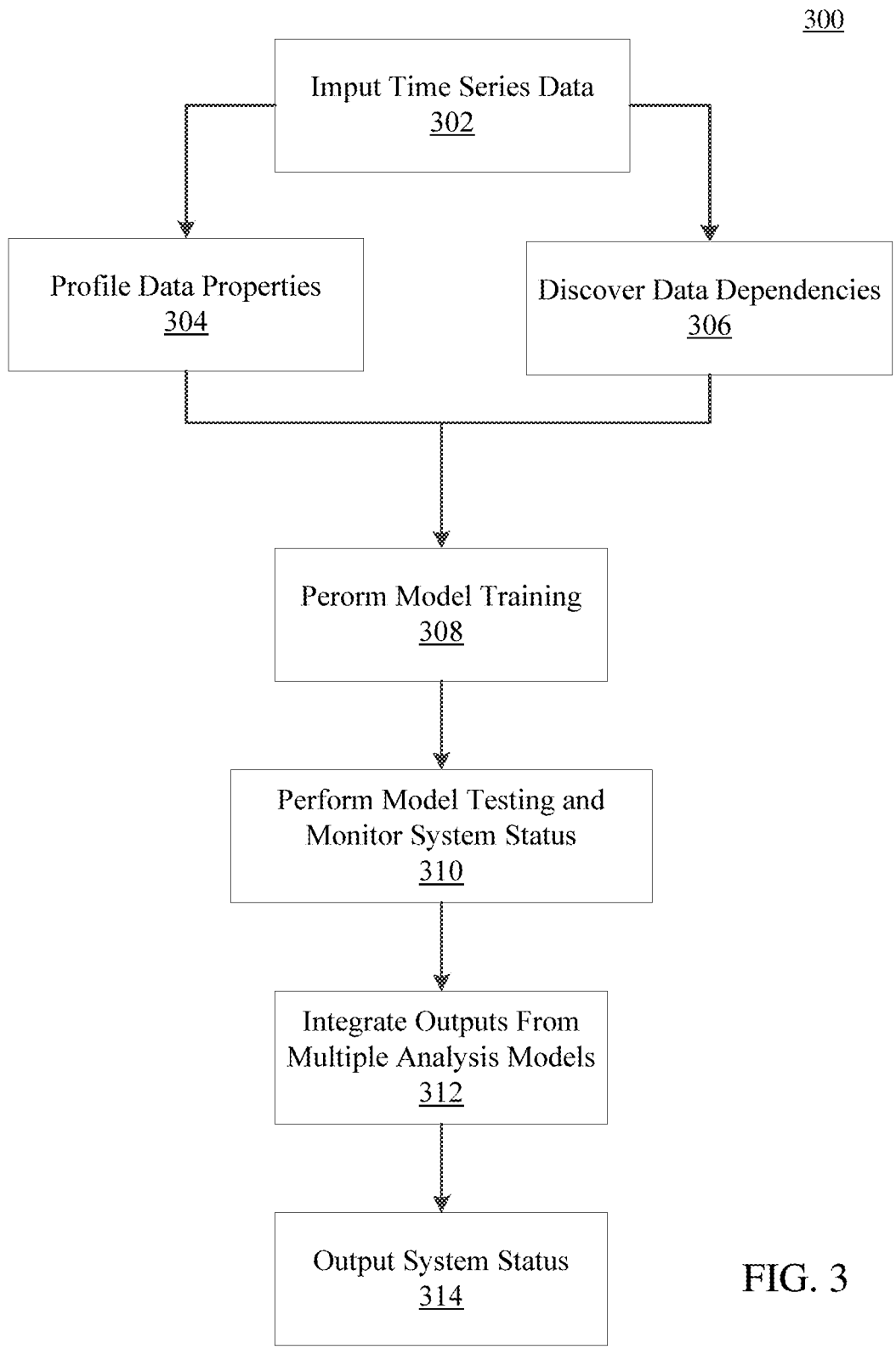
FIG. 3 is a block/flow diagram of a method for modeling time series dynamics with integrated outputs in accordance with the present principles.

Referring now to FIG. 3, a block/flow diagram of a method for modeling time series dynamics with integrated outputs 300 is illustratively shown in accordance with the present principles. In one embodiment, time series data may be input in block 302. Properties of the data may be profiled in block 304, and complex data dependencies may be discovered (e.g., from bottom to top) in block 306. Model training 308 and model testing 310 may be performed using an ensemble of analysis models, each of which may cover a specific data property within a unified framework. An architecture may be provided for integrating outputs from a plurality of analysis models in block 312, and the final system status report may be output in block 314.

Figure 4:
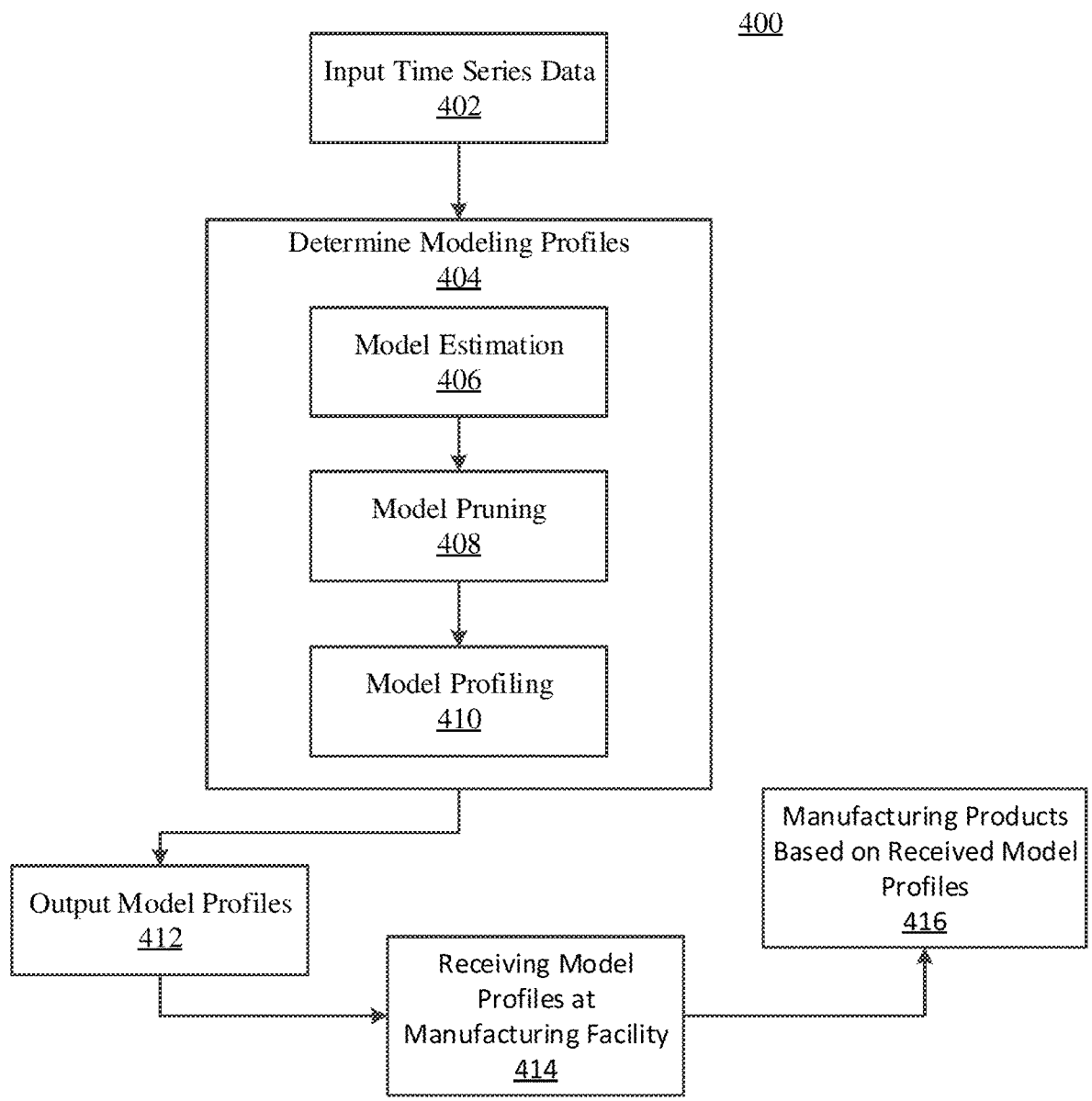
FIG. 4 is a block/flow diagram of a method for generating modeling profiles in accordance with the present principles.

Referring now to FIG. 4, a block/flow diagram of a method for generating modeling profiles 400 is illustratively depicted in accordance with the present principles. Time series data may be generated and/or input in block 402, and may be represented by $x_t$. The model parameters (e.g., $\theta$) may be learned (e.g., estimated) in block 406 based on the input data. In one embodiment, different models may have different types of parameters and may follow different learning processes. For example, in a model that discovers the periodic behavior of $x_t$, the frequency distribution and auto-correlation function (ACF) of $x_t$ may be leveraged to learn the parameters that describe the shape of $x_t$'s period. In learning the dependency between a pair of attributes, the parameters of an ARX model may be employed to capture their delay-aware correlations.

In one embodiment, different models may have different representations, but they may all include a common metric, which may be represented as the fitness score F. The fitness score may reflect the goodness of fit for a given time series. For example, a time series with weak periodicity behaviors may receive a low fitness score in the periodic model. The computation of fitness may vary with each model. In the periodic model, it may be based on the magnitude of dominant components in $x_t$'s frequency distribution, whereas the fitness of pairwise correlation may be based on the average estimation error of the ARX model. The fitness score may be employed to remove irrelevant time series from each model. For example, a threshold may be defined and time series whose fitness scores are below that threshold may be pruned out in block 408. As a result, each model may cover a group of time series that follow the data property of that model.

In one embodiment, if $x_t$ has a high fitness score, that time series may be further profiled in block 410 based on the learned properties to determine an overall modeling profile 404. In addition to the fitness score F, two other elements may also be included in $x_t$'s profile: the learned model parameters $\theta$, as well as the maximum error $\Delta$ obtained when fitting $x_t$ to the model based on $\theta$. While model parameters are employed to generate the prediction of future observations during online monitoring, the maximum error $\Delta$ may be employed as the threshold to check the deviation of the predicted value from the real observation. Given a large number of time series, the model may scan them one by one, learn the model parameters, and may only keep those with high fitness scores. For each selected time series, a profile $\{\theta, F, \Delta\}$ may be built, so that its future observations may be checked based on that profile, and the model profiles may be output in block 412.

In one embodiment, the model profiles output in block 412 are received by one or more computing systems at a manufacturing facility in block 412. The computing systems for receiving the model profiles may also be remote to the manufacturing facility, but in contact with the production equipment at the manufacturing facility (e.g., via Internet, cloud-based, etc.) in accordance with various embodiments of the present principles. One or more of a plurality of products (e.g., plastics, glass, syringes, food items, electricity, shaped rubber items, etc.) can be automatically manufactured at increased production speed, accuracy, and quality in block 416 based on the received model profiles, automatic measurements, etc.

In some embodiments, the model estimation 406, model pruning 408, and model profiling 410 may be iteratively performed throughout the manufacturing process in block 416, and may include anomaly detection throughout the manufacturing. During the manufacturing in block 416, the manufacturing system also automatically accounts for anomalies which have been detected during the model profiling in accordance with the present principles.

Figure 5:
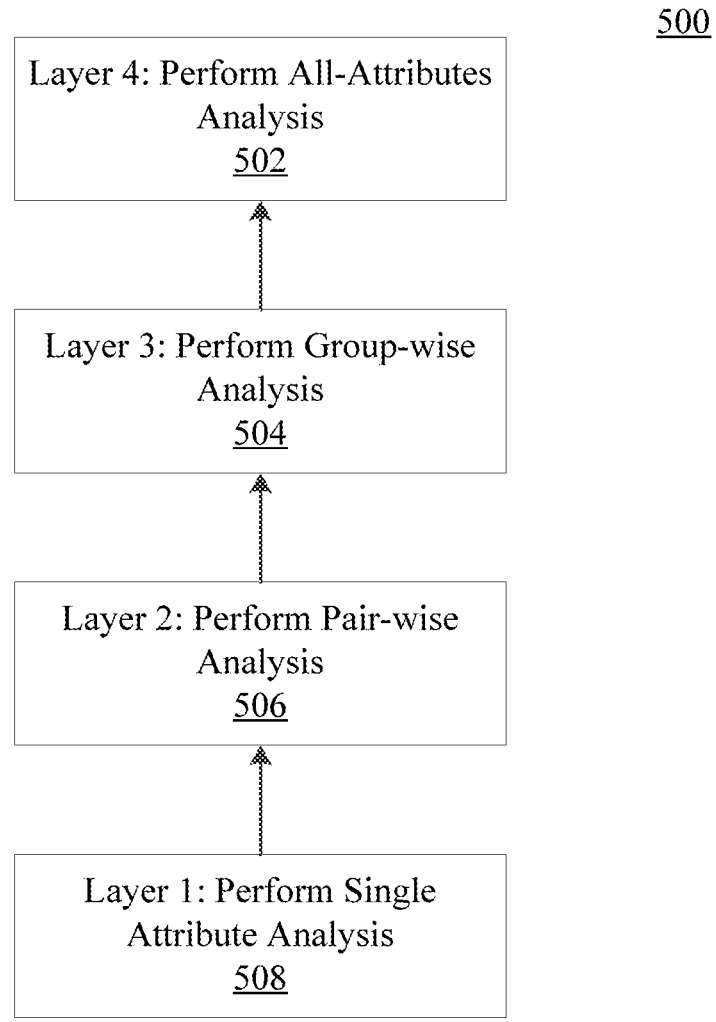
FIG. 5 is a block/flow diagram of a method for data property discovery for time series dynamics in accordance with the present principles.

Referring now to FIG. 5, a block/flow diagram of a method for data property discovery for time series dynamics 500 is illustratively depicted in accordance with the present principles. In one embodiment, data in physical systems may be relatively deterministic and may follow certain regularities. Each attribute may be profiled once appropriate properties in its data are discovered. However, different attributes may follow different patterns that may be unknown during profiling. The analytic engine, may define a plurality of potential properties that may be expected to exist in measurement data based on physical systems. For each candidate data property, a model may be constructed to discover the group of time series that follow the appropriate property and corresponding profiles may be built.

In one embodiment, there may be a plurality of properties in physical data that correspond to different aspects of system evolutions. For example, for each individual attribute, its time series may show constant, periodic, autoregressive, or other behaviors. There may also be various types of dependencies across different groups of attributes. Data properties modeled in the engine may be classified into four categories, which are illustratively depicted in FIG. 5, and labeled as layer 1 through layer 4. Each layer may represent a specific data dependency relationship, ranging from the single attribute analysis 508, pairwise relationship analysis 506, group wise analysis 504, to full attribute analysis 502. While the first layer may mainly describes data properties within a single attribute, the upper layers may capture higher-order attribute interactions gradually to leverage more complex data properties in accordance with the present principles.

In one embodiment, the single attribute analysis 508 may build a plurality of models to describe properties from individual time series, such as the periodic model for signals with periodicity, the constant model for nearly constant signals, the cumulative sum (CUSUM) model for time series with weak dynamics, the autoregressive (AR) model to measure linear signal dynamics, etc. Pairwise analysis may be performed in block 506 to model correlations between one or more pairs of system attributes. Note that the measurement of each attribute may be a time series, and the correlation of two time series may involve multiple time points. That is, the value of one attribute may affect not only the immediate value of the other attribute but also may affect values with some time delays. The AutoRegressive model with eXternal input (ARX) may be leveraged because it may learn the delay-aware correlation between each pair of time series, and a new search mechanism which quickly identify attribute pairs that exhibit high correlations may be employed according to the present principles.

In one embodiment, a group-wise analysis 504 may be performed for relationships among multiple time series. A delay-aware multivariate regression model may be employed in the engine to cluster time series and capture correlations in each cluster. The top layer relates to performing an all-attributes analysis 502, which may analyze the behavior and dependencies for all attributes in the systems. Following the group-wise analysis 504, the all-attributes analysis may consider inter-cluster correlations of attributes to obtain a global picture of data distribution.

Each data property in the layers 502, 504, 506, 508 may be associated with a model in the engine, which may discover a set of time series that follows that property. While the analytic engine may model as many data properties as possible, it may not be guaranteed to include all the necessary properties in all measurement data. However, a common interface may be employed for all the models in the engine, so that new models may be easily added to enhance engine performance. A model integrator may be employed to combine information from all the models and to generate an overall report of system operation.

Figure 6:
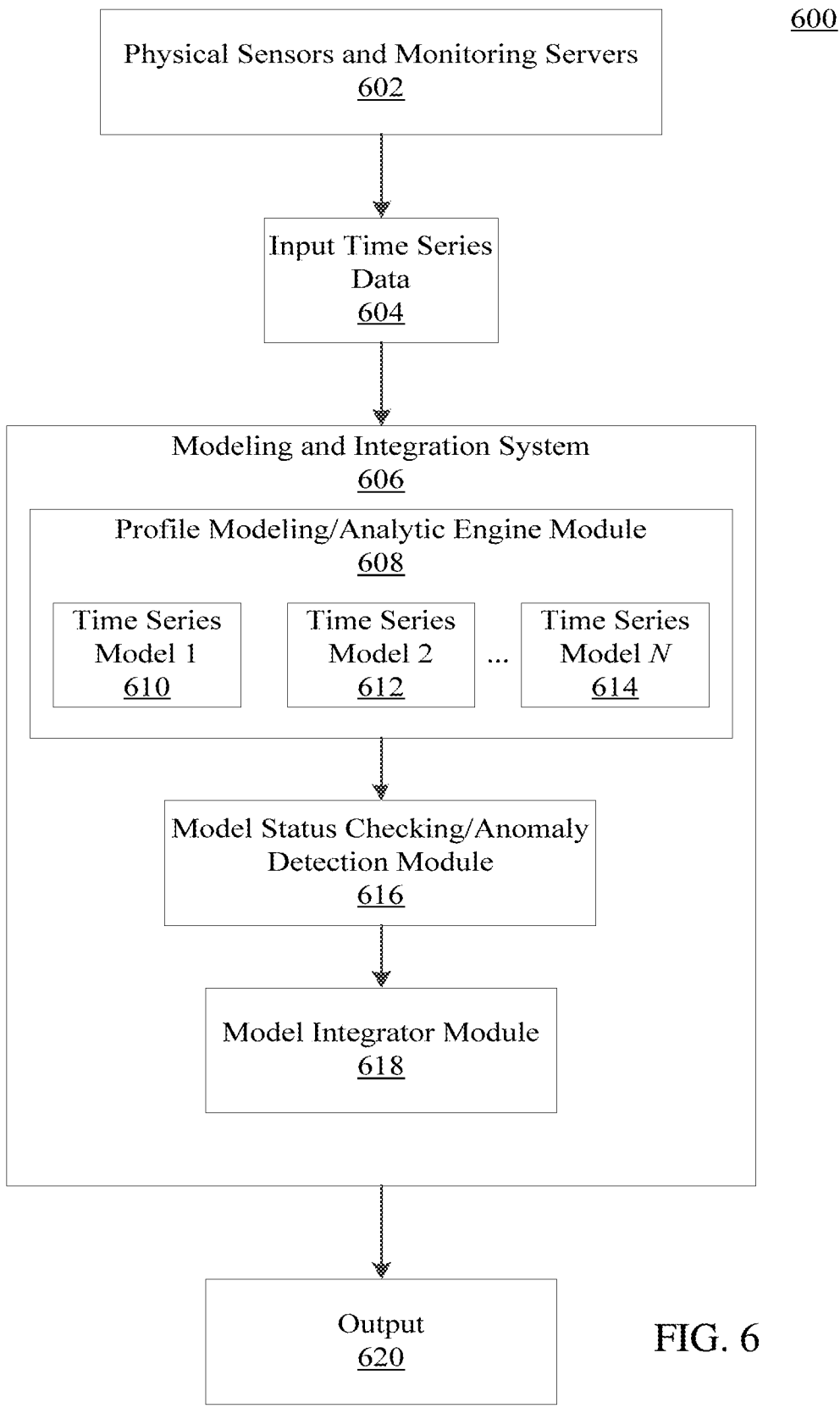
FIG. 6 is a block/flow diagram of a system for modeling time series dynamics with integrated outputs in accordance with the present principles.

Referring now to FIG. 6, a block/flow diagram of a system for modeling time series dynamics with integrated outputs 600 is illustratively depicted in accordance with the present principles. In one embodiment, data is collected by employing, for example, physical sensors and/or monitoring servers in block 602. The sensors may collect a plurality information (e.g., temperature, pressure, etc.), and time series data may be generated and input in block 604 into the modeling and integration system 606.

In one embodiment, the profile modeling/analytic engine module 608 may include a plurality of models (e.g., Model 1, Model 2, . . . Model N, as shown in blocks 610, 612, and 614, respectively), each of which may profile a group of time series that follow a specific data property. The models may include all the measurement data, and as such, each time series may generate a model that includes the profile of its behaviors. In the online monitoring process, as shown in FIG. 5, new measurements of all time series will be dispatched to corresponding models. The model status checking/anomaly detection module 616 may check the values of associated time series based on their profiles, and may report the status to the model integrator module 618. The model integrator module 618 may combine reports from some or all of the models and may generate and output a global report of the system status in block 620.

In one embodiment, each model may contain a profile (e.g., $\{\theta, F, \Delta\}$) for each covered time series. During the monitoring process, the value of new observations at every time t may be predicted based on $x_t$'s profile as well as its past observation at, for example, t–1, t–2, . . . t–N. The predicted value of $x_t$ may be represented as $\hat{x}_t$. The model may also receive the real observation $x_t$ at time t, and the absolute difference between $\hat{x}_t$ and real observation $x_t$ may be calculated as the residual $r_t=|x_t-\hat{x}_t|$. If $r_t$ is larger than the threshold $\Delta$ in $x_t$'s profile, it may indicate that the newly observed value deviates from the model. If a predetermined number (e.g., 3, 4, etc.) of consecutive threshold violations are observed, the profile modeling/analytic engine module 608 may determine that the deviation is caused by some faults in the system rather than the noise, and may send a status report to the model integrator module 618. The status report may be represented as an information tuple (e.g., time, model ID, attribute ID, fitness), and may contain one or more of a time stamp of the last violation, IDs of the model and time series, and the fitness score of that time series with respect to the model.

In one embodiment, at each time t, the model integrator module 618 may receive status reports from all the models 610, 612, 614, each of which may relate to an alert from measurement data. The number of those alerts may reflect the health of the system. In addition, since the alerts may be derived by inputting related time series into the model, the goodness of that fit may reflect the overall reliability of the alert. Therefore, the summation of fitness values from the received status reports may be employed to describe the system status, which may be denoted as the 'anomaly score' of the system, and may be detected in block 616. The anomaly score may be based on the sum of alerts at time t with each alert weighted by its associated fitness value. A high anomaly score may mean that the system significantly deviates from its normal situations. Once the anomaly score exceeds a predefined threshold, the model integrator module 618 may generate and output an alarm in block 620 so that system operators may be informed regarding any possible problems with the operation of the system.

In one embodiment, the fitness value in each model may be normalized between –1 and 1, so that all the models may be treated equally in the status integration. Once an alarm has been generated, the operator may pinpoint the root cause of the problem based on a plurality of factors including the model IDs and attribute IDs from status reports, as well as a plurality of advanced diagnosis models, some of which are discussed in further detail hereinafter. The first four models discussed (constant model, cumulative sum (CUSUM) model, auto-regressive (AR) model, and periodic model) may be associated with the single attribute analysis, which may model the data properties in individual time series. One model (pairwise time series model) may be associated with the pairwise analysis, and another model (multivariate time series model) may be associated with the group-wise analysis.

In one embodiment, the constant model may capture signals whose values are almost a constant (e.g., having small deviations around the mean). Given measurements of a time series (e.g., $x_t$, t–1, . . . , N), the mean $$\mu = \frac{1}{N}\sum_{t=1}^{N} x_t,$$

where N represents the number of samples in the time series, and variances $$\sigma^2 = \frac{1}{N-1}\sum_{t=1}^{N}(x_t - \mu)^2$$

may be computed as model parameters $\theta=[\mu,\sigma^2]$. The following fitness score describes an illustrative example of the level of variances that may be present in $x_t$: $F=1-\sqrt{\sigma_2/\mu}$. In one embodiment, low $\sigma^2$ values may lead to high fitness scores, where F represents the fitness score. F may reach the highest value 1 when the time series is a pure constant, (e.g., $\sigma^2=0$). The levels of $\sigma^2$ may also depend on the mean $\mu$. For example, a signal with mean $\mu=100$ (and variance $\sigma^2=1$ may be nearer to a constant compared with a signal with $\mu=10$ and variance $\sigma^2=1$. Therefore, the mean $\mu$ may be added in $F=1-\sqrt{\sigma^2/\mu}$ to represent the effect of base value in the fitness.

The model may select those time series whose fitness F is larger than $\gamma$, where $\gamma$ may be a predefined parameter based on expectations of constant signals, and a common $\gamma$ can range from 0.3 to 0.8. For the selected time series, the threshold $\Delta$ used for the online monitoring may be further computed as follows:

$$\Delta = \max_{t-1,\ldots,N} \frac{|x_t - \mu|}{F},$$

which may be defined as the maximum deviation of $x_t$ from mean $\mu$ divided by the fitness F. In one embodiment, larger deviations (e.g., $|x_t-\mu|$) may lead to a large bound for error checking. The fitness F may be placed in the denominator of $$\Delta = \max_{t-1,\ldots,N} \frac{|x_t - \mu|}{F}$$

because those time series with lower fitness may have larger uncertainties and hence may employ wider band in checking their behaviors.

In one embodiment, by employing the profile $\{\theta, F, \Delta\}$ of each covered time series $x_t$, the residual of each new observation obtained during the online monitoring may be computed by $r_t=|x_t-\mu|$ and compared with the threshold $\Delta$ to check the online status. Note that as compared with $r_t=|x_t-\hat{x}_t|$, the expected value of $x_t$ during the monitoring may be its mean $\mu$.

While the constant model may discover time series with small variances, in one embodiment, the CUSUM model may focus on a set of attributes with stable means. That is, although some attributes may include large variances, their values may continuously oscillate around the mean. CUSUM is a sequential analysis technique employed in process control. It may define two counters $C^+$ and $C^-$ for each time series $x_t$, which may accumulate the deviation of $x_t$ above the mean (e.g., $x_t-\mu$) and below the mean (e.g., $x_t-\mu$), respectively.

Because $x_t$ may oscillate around the mean, if the value of $x_t-1$ is above the mean, which may lead to an increase of $C^+$ and decrease of $C^-$, the next value $x_t$ may be expected to be below the mean (e.g., with an decrease of $C^+$ and increase of $C^-$). As a consequence, the counters $C^+$ and $C^-$ are normally set to keep small values. To measure the goodness of the CUSUM model for a selected time series, the fitness score may be computed, the counters may be updated for each new observation in the online monitoring, and the deviation error may be computed.

In one embodiment, the AR model is employed according to the present principles. The AR model is a general technique in time series analysis which may capture the auto-regressive behavior series (e.g., the current value of the time series may be highly correlated with previous observations. Given the measurements of $x_t$ as training data, the least square regression may be employed to estimate model parameters, and also to determine the estimated value $\hat{x}_t$. The AR model may select time series with fitness larger having strong auto-regressive behaviors. For each selected series, its threshold $\Delta$ may be determined from the estimation error $r_t$s, which may be the maximum of $r_t$ from the training data. During the online monitoring, given every new $x_t$, the predicted value $\hat{x}_t$ may be estimated based on the computed residual $r_t$ and may be compared with the threshold $\Delta$ to infer the status of $x_t$.

In one embodiment, a periodic model which may focus on signals that exhibit periodicity behaviors is employed in accordance with the present principles. The periodic model may contain two parts: periodicity detection and time series profiling. In the first step, the time series in the frequency domain may be analyzed and a fitness score may be defined to measure whether the series is periodic or not. For a time series $x_t$ with high fitness, the second step may estimate the period length T from $x_t$'s auto-correlation function (ACF) and may build a profile for $x_t$. A feature of a periodic time series $x_t$ is that it may contain dominant frequencies in its evolution. Fast Fourier transform (FFT) may be employed to compute the power spectrum $X_n$ of $x_t$, where $n=1, \ldots, \lceil N \rceil$, and the majority of the power may be occupied by a small number of dominant frequency components.

In one embodiment, to capture the 'dominance' phenomenon in the power distribution, power $X_n$s may be ordered from high to low, and the minimum number of top components, denoted as K, that contains 90 percent of $X_n$'s total power, may be determined. A small K value may mean that there exists dominant frequencies in $x_t$'s power spectrum, and hence $x_t$ may be more likely to exhibit periodic behaviors. The probability distribution of K, P(K), when $x_t$ is a random sequence (e.g., non-periodic), may be estimated. From that distribution, a bound K* may be inferred such that as long as K is smaller than K* there exists a high confidence that $x_t$ may be a periodic signal. As a result, the fitness of $x_t$, a may be defined as $$F = \frac{K^* - 2K + 1}{K^* - 1},$$

where F represents the fitness score, K* represents the number of expected components in a power distribution, and K represents the actual number of components in a power distribution. When there is only one dominant frequency component in $x_t$'s power distribution, there may exist K=1, with the highest fitness score of F=1. When the number K reaches K*, the fitness score may drop to −1. In one embodiment, only those time series whose fitness scores are larger than −1 (e.g., with less than K* dominant frequencies) may be selected.

In one embodiment, once $x_t$ is determined as periodic, its period length may be further estimated and corresponding profile may be built for it. Frequency analysis may still be employed to infer $x_t$'s period length T, but the result is not accurate due to the low time resolution in the frequency domain. Instead the auto-correlation function (ACF) of $x_t$ may be computed. The ACF may describe the correlation of $x_t$ with its lagged observations for all different lag $\tau$s. If $x_t$ is periodic with length T, $x_t$ may be maximally correlated with its previous cycles (e.g., $x_{t-T}$, $x_{t-2T}$). That is, there may exist peaks at positions $\tau=kT$, $k=1, 2, \ldots$, in the ACF curve, where k represents any point in the ACF curve, and $\tau$ represents positions of possible peaks. A robust method (e.g., algorithm) may be employed to extract those peaks, and the T value may be obtained by estimating the greatest common divisor (GCD) of the peak positions.

In one embodiment, once the period length T is obtained, the harmonic model may be employed to describe the shape of period $x_t = \sum_{j-1}^{J} \{a_j \sin(j\omega t) + b_j \cos(j\omega t)\} + c$, which may be represented as the composition of a set of harmonic waves with frequencies $\omega, 2\omega, \ldots, N\omega$, where $x_t$ is a time series model, and J is a number of harmonic components. The fundamental frequency may be represented as $\omega=2\pi/T$, and there may be $N=\lceil T/2 \rceil$ possible frequencies due to the Naquist sampling theory. Given the measurements of $x_t$ as the training data, the least squares regression may be employed to estimate model parameters (e.g., $\theta=[a_1, b_1, \ldots, a_J, b_J, c]$). The residuals of $x_t$ may be obtained from the harmonic model (e.g., $r_t=x_t-\hat{x}_t$) where $\hat{x}_t$ may be the estimated value from $x_t=\sum_{j-1}^{J} \{a_j \sin(j\omega t) + b_j \cos(j\omega t)\} + c$. The threshold $\Delta$ may then be defined as maximum $r_t$ value obtained from model training. During the online monitoring, given a new $x_t$ value at time t, its estimated value may be obtained based on the harmonic model with parameters $\theta$, and generate the residual $r_t$. The status of $x_t$ may then inferred by comparing $r_t$ with the threshold $\Delta$.

In one embodiment, a pairwise time series model is employed according to the present principles. While previously discussed models deal with data properties in a single time series, there also may exist correlations among a group of time series due to the dependencies between physical processes in the system. The pairwise time series model may focus on the dependencies between one or more pairs of time series (e.g., $x_t$ and $y_t$). There are several ways to model their dependencies, and for illustrative purposes, an engine employing an AutoRegressive model with eXternal input (ARX) will be discussed to describe the relationship because ARX may capture dependencies of both current and previous values of two time series. That is, the current value (e.g., $y_t$), may be correlated with not only the current value of $x_t$ but also the past values of both $x_t$ and $y_t$. The maximum lags of both time series involved may be represented as [n, m, k], and the maximum lags may be called as the order of ARX.

As opposed to the models previously discussed above, the pairwise time series model may search the correlation between each pair of time series in the training process, which may require many computations for systems with a large number of attributes. As such, a technique that utilizes some heuristics to speed up the correlation search may be employed. For example, if it is found that $(x_t, y_t)$ and $(y_t, z_t)$ are correlated pairs, it may be directly inferred that $x_t$ and $z_t$ are also correlated.

In one embodiment according to the present principles, a multivariate time series model may be employed. In addition to the correlation between pairs of time series discussed above, the correlation among a group of time series may also be modeled according to the present principles. That is, the values of time series $y_t$ may depend on multiple other series (e.g., $x_t^{(1)}, x_t^{(2)}, \ldots$), rather than just one. The multivariate regression may be employed to describe the relationship: $y_t = w_0 + w_1 x_t^{(1)} + w_2 x_t^{(2)} + \ldots + w_g x_t^{(g)}$. It is generally not known, and it is not necessary to know the subset of time series $x_t^{(1)}, \ldots, x_t^{(g)}$ that are involved in the above equation, where $x_t$ represents a time series, $y_t$ represents a time series, and $w_{0-g}$ may represent coefficients for dependency between, for example, $y_t$ and $x_t$. Without domain knowledge, all other attributes except $y_t$ may be the candidates. In the model, all the possible variables may be placed in the right side of the above equation, and then the model coefficients (e.g., $w = \lfloor w_0, w_1, \ldots, w_g \rfloor$) may be regularized to select relevant coefficients. That is, rather than using the least squares method, the coefficients may be estimated by minimizing an objective function.

In the training process, the multivariate model may treat every attribute as $y_t$ and may apply the above optimization to discover its dependent attributes. Based on the parameters of discovered relationship (e.g., $\theta = \lfloor w_0, w_1, \ldots, w_g \rfloor$), the estimation error $r_t$ may be obtained. The fitness may then be determined, and for those relationships with high fitness (e.g., F>0.6), the threshold $\Delta$ may be computed as the maximum of $r_t$ from the training data. During the monitoring, the error $r_t$ may be captured given new observations, and the error may be compared with threshold $\Delta$ to check the status. Similarly to the pairwise time series model, past observations of each time series may be added in the regression.

In one embodiment, the multi-layer time series analytic engine has been evaluated on several physical systems, including a power plant system, an automobile system, and a glass manufacture plant, and has advantageously exhibited a high level of effectiveness in system modeling and anomaly detection application. One important application of our analytic engine is the automatic system monitoring. The system may be found to be in a healthy condition if all the monitoring data fits the estimated models. Some anomaly events can be detected when one or some of the models are broken for the testing data. In the training stage, a set of different models may be learned, and may be employed for prediction.

As discussed above, the data analytic engine according to the present principles may be employed for complex physical system self-management. Based on the strong regularity and high diversity data characteristics observed in physical systems, the analytic engine may profile the system monitoring data with an ensemble of models, each of which may have discovered a specific data property. The extracted data profiles may be employed to facilitate a plurality of management tasks, such as system status monitoring and online anomaly detection.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 7:
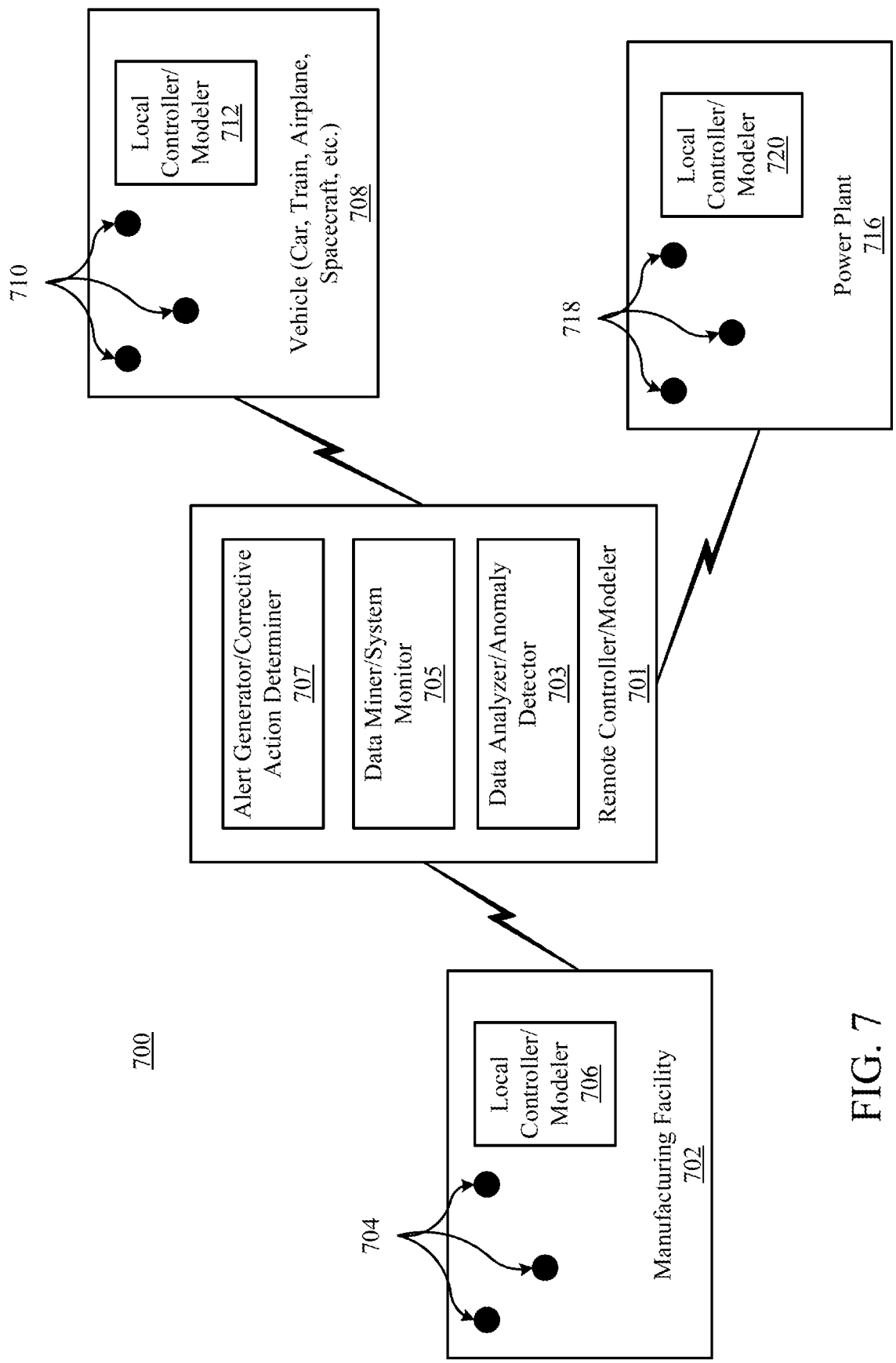
FIG. 7 is a high-level block/flow diagram of a system for monitoring and controlling of complex physical systems in accordance with the present principles.

Referring now to FIG. 7, a high-level block/flow diagram of a system 700 for monitoring and controlling one or more complex physical systems is illustratively depicted in accordance with the present principles. In one embodiment, a remote controller/modeler 701 may be employed to manage and control operations of a plurality of complex physical systems, including, for example, a manufacturing facility 702, a vehicle 708 (e.g., car, train, airplane, spacecraft, ect.), a power plant 716, etc. in accordance with the present principles. The remote controller/modeler 701 may perform all or some of the steps described with respect to the methods 200, 300, 400, and 500 of FIGS. 2, 3, 4, and 5, respectively, in accordance with various embodiments.

The remote controller/modeler 701 may include a data analyzer/anomaly detector 703 for determining when an anomaly occurs, and the cause of such an anomaly in the facilities 702, 708, 716. An alert generator/corrective action determiner 707 may be employed to alert facility workers of a detected anomaly using any of a plurality of communication interfaces (e.g., cell phone, email, sound alarm in facility, etc.), and a corrective action to resolve the anomaly condition and/or to prevent future anomalies may be determined in block 707, and performed using the remote controller/modeler 701.

The anomalies detected may be detected using data mined from monitoring the facilities 702, 708, 716 (e.g., from sensors, reports, etc. deployed throughout the facilities/vehicles 702, 708, 716) using a data miner/system monitor 705, and the models generated by the methods 200, 300, 400, and 500 of FIGS. 2, 3, 4, and 5, respectively in accordance with various embodiments. The sensors 704, 710, 718 may include any of a plurality of sensors (e.g., temperature, pressure, etc.) that are capable of being deployed in a particular type of facility/vehicle/etc. It is noted that the functions of the remote controller/modeler

701 may also be performed locally using a local controller/modeler 706, 712, 720 in accordance with the present principles.

In accordance with various embodiments, the remote controller/modeler 701 includes a novel data analytic engine/anomaly detector 703 for complex physical system self-management. Based at least in part on the strong regularity and high diversity data characteristics observed in physical systems, the system 700 profiles the system monitoring data with an ensemble of models, each of which has discovered a specific data property. The extracted data profiles may be utilized to facilitate and/or automate a plurality of management tasks (e.g., system status monitoring, online anomaly detection, etc.) The experimental results in a real power plant have demonstrated that a plurality (e.g., up to 88%) of system metrics and actions can be monitored and controlled using the system 700.

In some embodiments, a plurality of types of abnormal situations (e.g., system inspection anomaly event, overheating, pressure alerts, etc.) in one or more complex physical systems 702, 708, 716 have been successfully detected in practice. The data analyzer/anomaly detector 703 detects and reports anomaly status significantly more quickly (e.g., 6 hours faster) than any conventional systems and methods based on the modeling and analysis performed by the remote controller/modeler 701. This increased detection and reporting with faster response times (e.g., near real-time) of, for example, detection of system anomalies, enables correction of such anomalies, using the controller 701, to increase productivity and minimize outages at one or more of a plurality of systems 702, 708, 716 in accordance with various embodiments of the present principles.

Having described preferred embodiments of a system and method for modeling, analyzing, and managing time series dynamics in complex physical systems (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for anomaly detection in complex physical systems, comprising:
   extracting, using physical sensors deployed in a complex physical system, features representative of a temporal evolution of the complex physical system;
   analyzing, in real time, the extracted features, the analyzing further comprising:
   deriving one or more vector trajectories by performing sliding window segmentation of one or more time series;
   applying a linear test to determine whether the one or more vector trajectories are linear or nonlinear; and
   performing linear or nonlinear subspace decomposition on the vector trajectory based on the linear test;
   generating, using a processor, a system evolution model from an ensemble of models based on the analysis of the extracted features of the complex physical system, wherein each of the ensemble of models corresponds to different data properties of the complex physical system;
   determining a fitness score by analyzing a plurality of the different data properties of the complex physical system based on specific data dependency relationships, the type of analysis being determined based on particular properties of the features extracted and corresponding aspects of the complex physical system;
   generating an alarm if the fitness score exceeds a predetermined number of threshold violations for any of the plurality of different data properties; and
   modeling system dynamics of the complex physical system, the modeling comprising:
   generating one or more time series models based on at least one of the fitness score or the alarm; and
   for each selected time series, generating a profile $\{\theta, F, \Delta\}$, with F representing a feature space, to enable checking future observations based on the profile with learned model parameters $\theta$ and a maximum error $\Delta$ to be obtained when fitting data to the model based on $\theta$, predicting new observations based on the profile and past observation, and determining if a deviation is caused by a system fault in the complex physical system rather than noise based on the checking and the predicting.

2. The method as recited in claim 1, further comprising controlling operations of the complex physical system using a controller located remotely from the complex physical system.

3. The method as recited in claim 1, wherein a window size is increased during the sliding window segmentation to improve detection precision.

4. The method as recited in claim 1, further comprising controlling operations of the complex physical system remotely, the controlling including implementing corrective action responsive to an indication of a determined system fault.

5. The method as recited in claim 1, wherein the system evolution model is constructed using a density based approach for a time series which lack smoothness in the one or more vector trajectories.

6. The method as recited in claim 1, wherein the system evolution model monitors a current system status of the complex physical system, and compares the current system status with the system evolution model to detect anomalies.

7. A system for anomaly detection in complex physical systems, comprising:
   a processor coupled to a memory, the processor being configured for:
   extracting, using physical sensors deployed in a complex physical system, features representative of a temporal evolution of the complex physical system;
   analyzing, in real time, the extracted features, the analyzing further comprising:
   deriving one or more vector trajectories by performing sliding window segmentation of one or more time series;
   applying a linear test to determine whether the one or more vector trajectories are linear or nonlinear; and
   performing linear or nonlinear subspace decomposition on the vector trajectory based on the linear test;
   generating a system evolution model from an ensemble of models based on the analysis of the extracted features of the system, wherein each of the ensemble of models corresponds to different data properties of a dynamical system;

determining a fitness score by analyzing, using an analytic engine, a plurality of the different data properties of the dynamical system based on specific data dependency relationships, the type of analysis being determined based on particular properties of the features extracted and corresponding aspects of the complex physical system;

generating an alarm if the fitness score exceeds a predetermined number of threshold violations for any of the plurality of different data properties; and modeling system dynamics of the complex physical system, the modeling comprising:

generating one or more time series models based on at least one of the fitness score or the alarm; and for each selected time series, generating a profile {θ, F, Δ}, with F representing a feature space, to enable checking future observations based on the profile with learned model parameters θ and a maximum error Δ to be obtained when fitting data to the model based on θ, predicting new observations based on the profile and past observation, and determining if a deviation is caused by a system fault in the complex physical system rather than noise based on the checking and the predicting.

8. The system as recited in claim 7, wherein a window size is increased during the sliding window segmentation to improve detection precision.

9. The system as recited in claim 7, the processor being further configured for controlling operations of the complex physical system remotely, the controlling including implementing corrective action responsive to an indication of a determined system fault.

10. The method as recited in claim 1, wherein the system evolution model is constructed using a density based approach for a time series which lack smoothness in the one or more vector trajectories.

11. The method as recited in claim 1, wherein the system evolution model monitors a current system status of the complex physical system, and compares the current system status with the system evolution model to detect anomalies.

12. A computer program product for anomaly detection in one or more complex physical systems, the computer program product comprising a non-transitory computer readable storage medium having program instructions embodied therewith, the program instructions executable by a processor to cause the processor to perform a method comprising:

extracting, using physical sensors deployed in a complex physical system, features representative of a temporal evolution of the complex physical system;

analyzing, in real time, the extracted features, the analyzing further comprising:

deriving one or more vector trajectories by performing sliding window segmentation of one or more time series;

applying a linear test to determine whether the one or more vector trajectories are linear or nonlinear; and performing linear or nonlinear subspace decomposition on the vector trajectory based on the linear test;

generating, using a processor, a system evolution model from an ensemble of models based on the analysis of the extracted features of the complex physical system, wherein each of the ensemble of models corresponds to different data properties of the complex physical system;

determining a fitness score by analyzing a plurality of the different data properties of the complex physical system based on specific data dependency relationships, the type of analysis being determined based on particular properties of the features extracted and corresponding aspects of the complex physical system;

generating an alarm if the fitness score exceeds a predetermined number of threshold violations for any of the plurality of different data properties; and modeling system dynamics of the complex physical system, the modeling comprising:

generating one or more time series models based on at least one of the fitness score or the alarm; and for each selected time series, generating a profile {θ, F, Δ}, with F representing a feature space, to enable checking future observations based on the profile with learned model parameters θ and a maximum error Δ to be obtained when fitting data to the model based on θ, predicting new observations based on the profile and past observation, and determining if a deviation is caused by a system fault in the complex physical system rather than noise based on the checking and the predicting.

13. The computer-readable storage medium as recited in claim 12, wherein the method further comprises controlling operations of the complex physical system using a controller located remotely from the complex physical system.

14. The computer-readable storage medium as recited in claim 12, wherein a window size is increased during the sliding window segmentation to improve detection precision.

15. The computer-readable storage medium as recited in claim 12, wherein the method further comprises controlling operations of the complex physical system remotely, the controlling including implementing corrective action responsive to an indication of a determined system fault.

16. The computer-readable storage medium as recited in claim 12, wherein the system evolution model is constructed using a density based approach for a time series which lack smoothness in the one or more vector trajectories.

17. The computer-readable storage medium as recited in claim 12, wherein the system evolution model monitors a current system status of the complex physical system, and compares the current system status with the system evolution model to detect anomalies.

* * * * *